(12) United States Patent
Matsunaga

(10) Patent No.: US 8,498,155 B2
(45) Date of Patent: Jul. 30, 2013

(54) NONVOLATILE SEMICONDUCTOR MEMORY DEVICE

(75) Inventor: Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 13/277,623

(22) Filed: Oct. 20, 2011

(65) Prior Publication Data

US 2012/0099374 A1 Apr. 26, 2012

(30) Foreign Application Priority Data

Oct. 21, 2010 (JP) .................................. 2010-236546

(51) Int. Cl.
*G11C 11/34* (2006.01)

(52) U.S. Cl.
USPC .................. 365/185.05; 365/189.15

(58) Field of Classification Search
USPC .................... 365/185.05, 189.15; 257/316
See application file for complete search history.

(56) References Cited

U.S. PATENT DOCUMENTS

| | | | | |
|---|---|---|---|---|
| 5,477,071 | A * | 12/1995 | Hamamoto et al. | 257/302 |
| 6,950,367 | B2 * | 9/2005 | Kaneko | 365/230.03 |
| 8,134,198 | B2 * | 3/2012 | Kamigaichi et al. | 257/316 |
| 2003/0107055 | A1 * | 6/2003 | Watanabe et al. | 257/208 |
| 2004/0232460 | A1 * | 11/2004 | Kajiyama | 257/295 |
| 2007/0120166 | A1 * | 5/2007 | Arai et al. | 257/296 |

FOREIGN PATENT DOCUMENTS

JP 2005-78779 3/2005

* cited by examiner

*Primary Examiner* — Douglas King
(74) *Attorney, Agent, or Firm* — Oblon, Spivak, McClelland, Maier & Neustadt, L.L.P.

(57) ABSTRACT

A nonvolatile semiconductor memory device includes a substrate including device regions extending in a first direction, a memory cell array region including a plurality of memory cells disposed on the device regions, bit lines extending in the first direction, a sense amplifier circuit connected to ends of the bit lines, and bit line contacts connecting device regions to bit lines. The memory cell array region includes first to N-th regions where N is an integer of two or more, and a K-th region is located at a greater distance from the sense amplifier circuit than a (K−1)-th region, where K is an arbitrary integer of 2 to N. Contact resistance of the bit line contacts in the K-th region is lower than contact resistance of the bit line contacts in the (K−1)-th region, each device region having constant width in the memory cell array region.

19 Claims, 8 Drawing Sheets

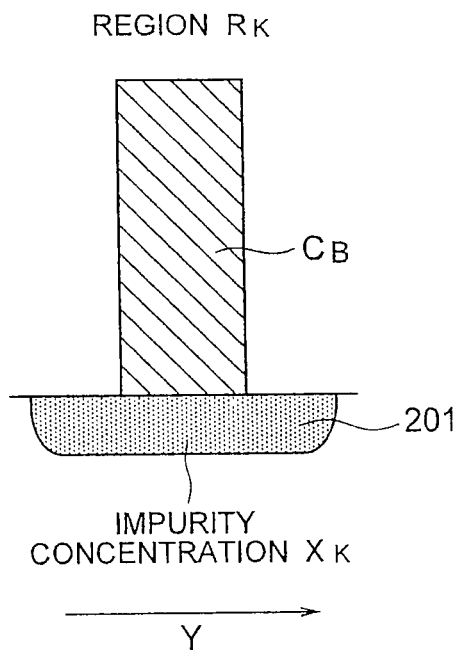
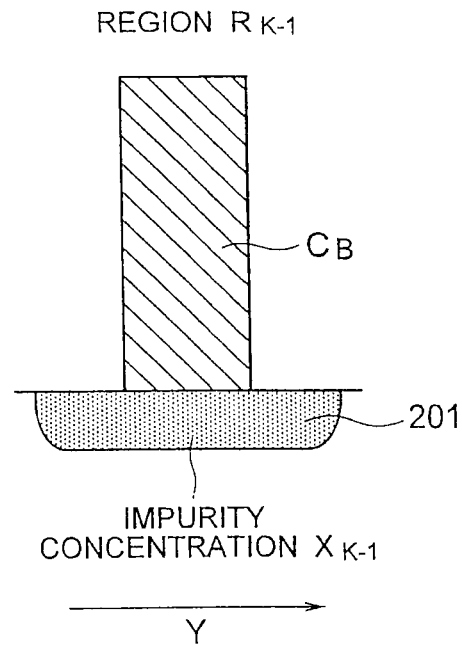
FIG.5A
FIG.5B
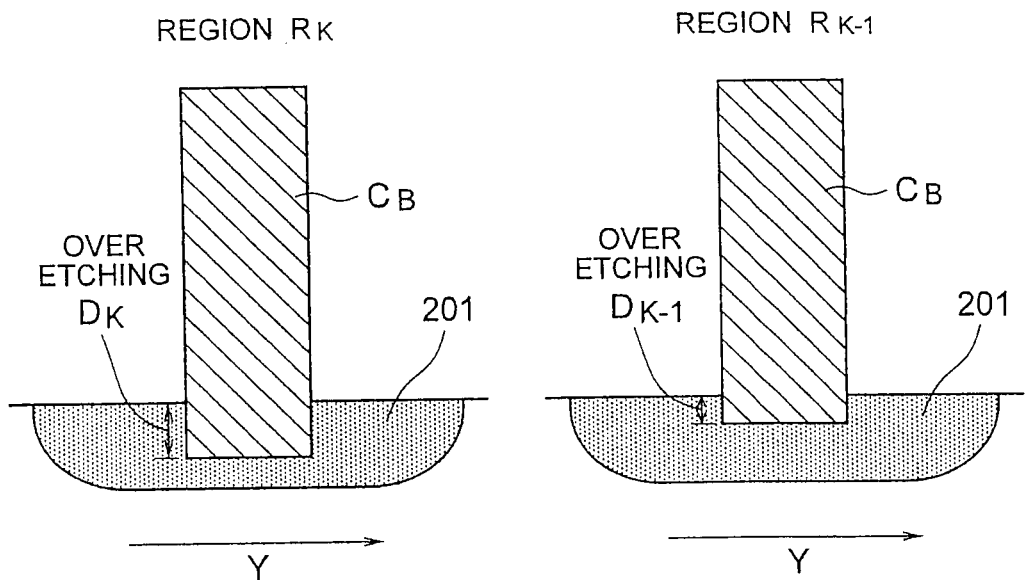
FIG.6A
FIG.6B

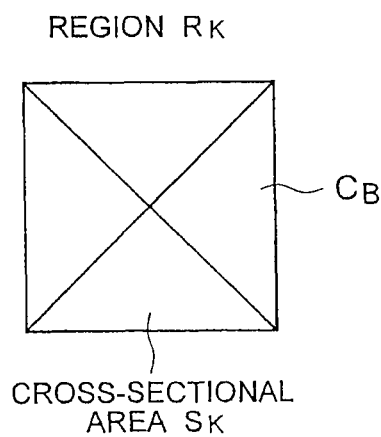
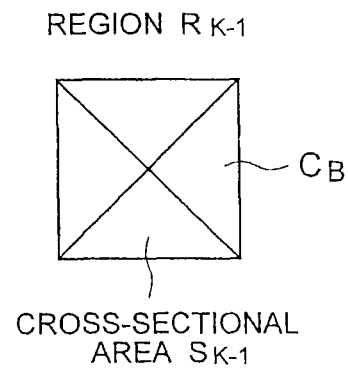
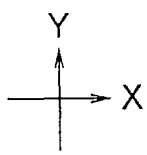
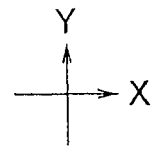
FIG.7A          FIG.7B

NONVOLATILE SEMICONDUCTOR MEMORY DEVICE

CROSS REFERENCE TO RELATED APPLICATION

This application is based upon and claims the benefit of priority from the prior Japanese Patent Application No. 2010-236546, filed on Oct. 21, 2010, the entire contents of which are incorporated herein by reference.

FIELD

Embodiments described herein relate to a nonvolatile semiconductor memory device.

BACKGROUND

In a nonvolatile memory such as a NAND memory, data is read out from a memory cell by a sense amplifier (S/A). The sense amplifier reads out the data from the memory cell by detecting and amplifying a voltage change or a current change on a bit line.

However, in the nonvolatile memory such as the NAND memory, the value of a cell current in an erase state varies according to the distance between the memory cell and the sense amplifier. The reason is that the bit line resistance between the memory cell and the sense amplifier increases according to the distance between them.

In addition, such a variation of the cell current becomes more remarkable as the size of the memory shrinks.

BRIEF DESCRIPTION OF THE DRAWINGS

FIGS. 5A and 5B are side sectional views showing a first example of the bit line contacts;

FIGS. 6A and 6B are side sectional views showing a second example of the bit line contacts;

FIGS. 7A and 7B are plan views showing a third example of the bit line contacts;

DETAILED DESCRIPTION

Embodiments will now be explained with reference to the accompanying drawings.

An embodiment described herein is a nonvolatile semiconductor memory device including a substrate, and device regions formed in the substrate to extend in a first direction which is parallel to a surface of the substrate. The device further includes a memory cell array region including a plurality of memory cells disposed on the device regions, and bit lines disposed above the substrate to extend in the first direction. The device further includes a sense amplifier circuit electrically connected to the bit lines at ends of the bit lines on one side, and bit line contacts disposed on the device regions to electrically connect the device regions to the bit lines. In addition, the memory cell array region includes first to N-th regions where N is an integer of two or more, and a K-th region is located at a greater distance from the sense amplifier circuit than a (K−1)-th region, where K is an arbitrary integer of 2 to N. In addition, contact resistance of the bit line contacts in the K-th region is lower than contact resistance of the bit line contacts in the (K−1)-th region, and a width of each device region is constant in the memory cell array region.

(First Embodiment)

Figure 1:
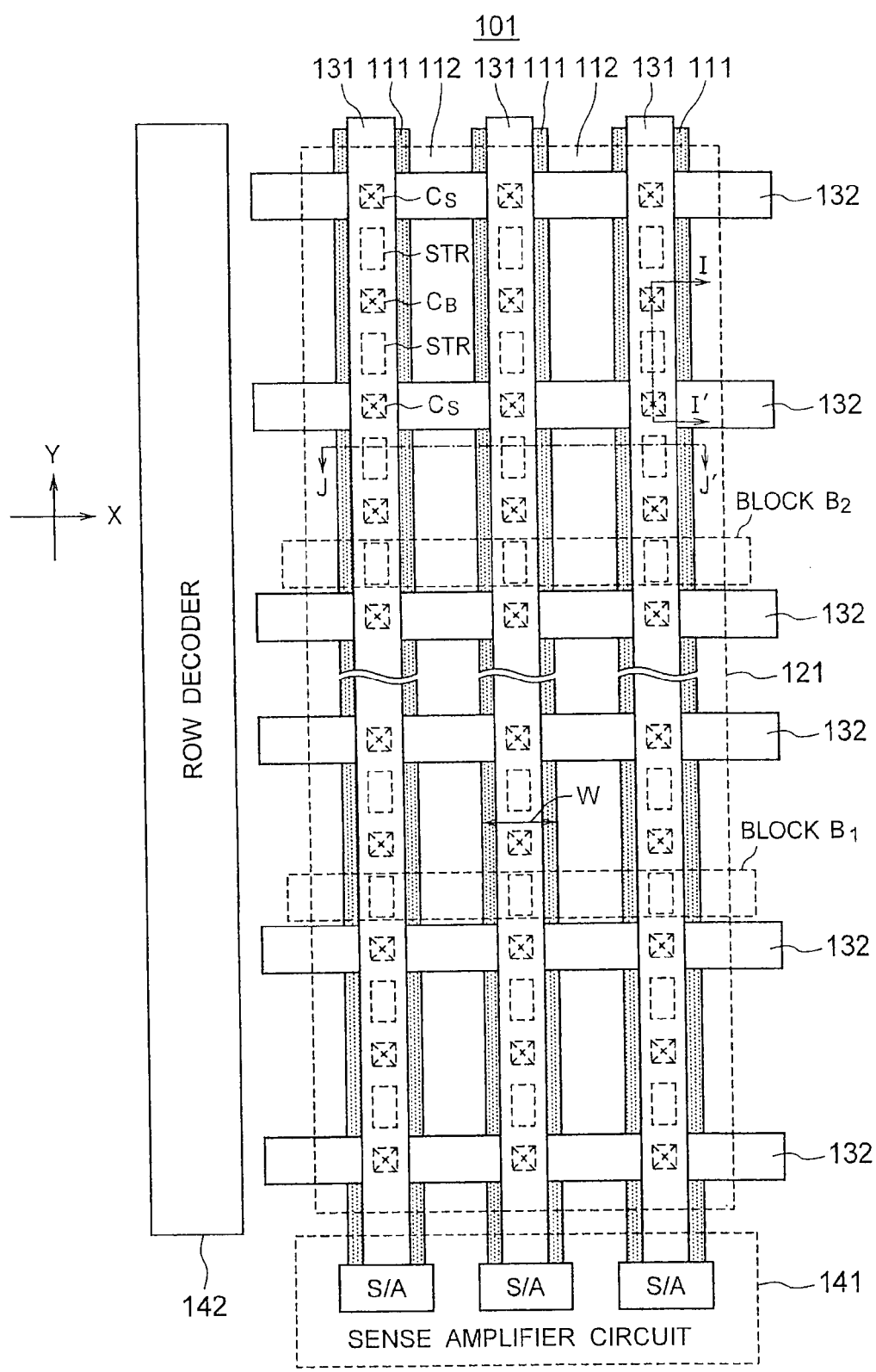
FIG. 1 is a plan view showing a structure of a nonvolatile semiconductor memory device of a first embodiment.

FIG. 1 is a plan view showing a structure of a nonvolatile semiconductor memory device of a first embodiment. The nonvolatile semiconductor memory device of FIG. 1 is a NAND memory.

FIG. 1 shows device regions 111 formed in a substrate 101 and corresponding to AA (Active Area) regions, and isolation regions 112 formed in the substrate 101 and corresponding to STI (Shallow Trench Isolation) regions.

FIG. 1 further shows X and Y directions which are parallel to a principal surface of the substrate 101, and are perpendicular to each other. The isolation regions 112 are formed in the substrate 101 to extend in the Y direction. The isolation regions 112 are formed of isolation insulators buried in isolation trenches on the substrate 101. The isolation regions 112 separate the substrate 101 into the device regions 111.

The device regions 111 are defined in the substrate 101 by the isolation regions 112 to extend in the Y direction. As shown in FIG. 1, both the device regions 111 and the isolation regions 112 extend in the Y direction and they are formed alternately along the X direction. The Y direction is an example of a first direction in the disclosure, and the X direction is an example of a second direction in the disclosure.

FIG. 1 further shows a memory cell array region 121 including a plurality of NAND strings STR formed on the device regions 111. As described later, each NAND string STR includes a plurality of memory cell transistors disposed in a line on a device region 111, and two select transistors disposed on the device region 111 to sandwich these memory cell transistors.

FIG. 1 further shows bit lines 131 formed above the substrate 101 to extend in the Y direction, and source lines 132 formed above the substrate 101 to extend in the X direction. The bit lines 131 are formed substantially just above the device regions 111. Furthermore, the bit lines 131 are electrically connected to the device regions 111 by bit line contacts $C_B$ which are formed on the device regions 111. In the same way, the source lines 132 are electrically connected to the device regions 111 by source line contacts $C_S$ which are formed on the device regions 111. The plane shape of each source line contact $C_S$ may be a shape other than a hole shape shown in FIG. 1. For example, the plane shape of each source line contact $C_S$ may be a trench shape formed to extend in the X direction.

As shown in FIG. 1, the source line contacts $C_S$ are disposed at intersections of the device regions 111 and the source lines 132. The bit line contacts $C_B$ are disposed between source line contacts $C_S$ which are adjacent in the Y direction. Each NAND string STR are disposed between a source line contact $C_S$ and a bit line contact $C_B$ which are adjacent in the Y direction.

FIG. 1 further shows a sense amplifier circuit 141 including a plurality of sense amplifiers (S/A), and a row decoder 142.

The bit lines 131 have ends on the "+Y" direction side and ends on the "−Y" direction side. The sense amplifier circuit 141 is disposed near the ends on the same side. Specifically, the sense amplifier circuit 141 is connected to the bit lines 131 at the ends of the bit lines 131 on the "−Y" direction side. The "−Y" direction side is an example of one side of the disclosure. Here, the expression "the sense amplifier circuit 141 are connected to the bit lines 131" includes the case where the sense amplifier circuit 141 is connected to the bit lines 131 via circuit devices such as transistors.

In the same way, the source lines 132 have ends on the "+X" direction side and ends on the "−X" direction side. The row decoder 142 is disposed near the ends on the same side, i.e., the "−X" direction side. The selection of a source line 132 is performed by a source line driver (not illustrated).

In FIG. 1, a width of each device region 111 is denoted by W. In this embodiment, the width W of each device region 111 is constant in the memory cell array region 121 irrespective of the distance from the sense amplifier circuit 141. Therefore, according to this embodiment, the processing margin of the device regions 111 can be improved, so that the width of the device regions 111 and the width of the isolation regions 112 can be made narrow.

Figure 2:
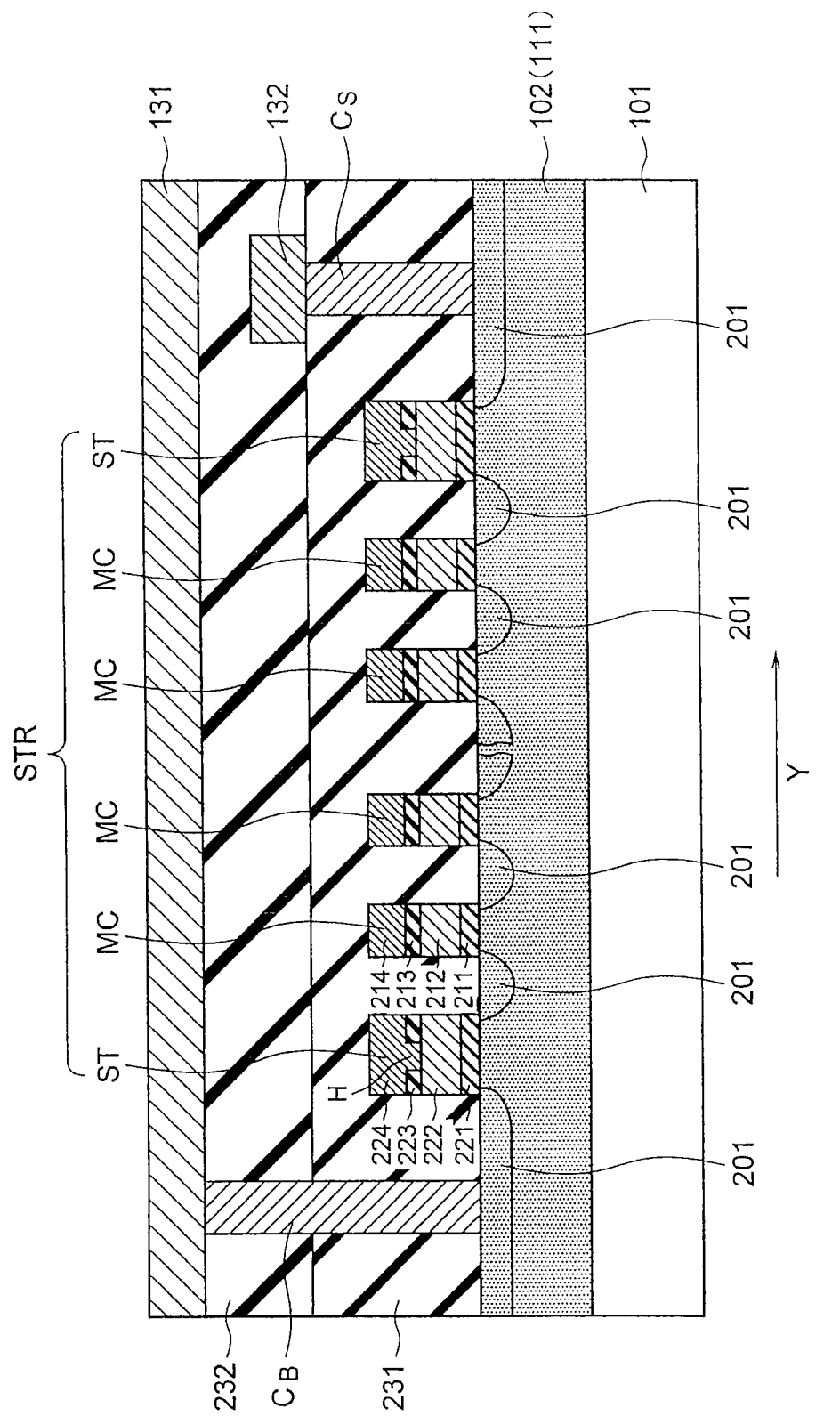
FIG. 2 is a side sectional view showing a section (I-I' section) of the semiconductor memory device of FIG. 1.

FIG. 2 is a side sectional view showing a section of the semiconductor memory device of FIG. 1. FIG. 2 is a sectional view taken along a line I-I' shown in FIG. 1.

FIG. 2 shows a well region 102 in the substrate 101, and a NAND string STR of a line formed on the well region 102 (to be more precise, formed on a device region 111 in the well region 102). The NAND string STR includes a plurality of memory cell transistors MC and two select transistors ST disposed to sandwich the memory cell transistors MC. The selection of a memory cell transistor MC in the NAND string STR is performed by the row decoder 142.

Each memory cell transistor MC includes a gate insulator 211, a floating gate 212, an intergate insulator 213, and a control gate 214 stacked on the device region 111 in order.

Each select transistor ST includes a first insulation film 221, a first electrode layer 222, a second insulation film 223, and a second electrode layer 224 stacked on the device region 111 in order. The first electrode layer 222 and the second electrode layer 224 are electrically connected to each other via an aperture H provided in the second insulation film 223 to serve as a gate electrode of the select transistor ST. On the other hand, the first insulation film 221 serves as a gate insulator of the select transistor ST.

The memory cell transistors MC and the select transistors ST forming the NAND string STR are connected in series by diffusion layers 201 formed in the device region 111.

FIG. 2 further shows inter layer dielectrics 231 and 232 formed on the substrate 101 in order. FIG. 2 further shows a source line contact $C_S$ formed in the inter layer dielectric 231, and disposed on a diffusion layer 201 which is located by the side of one select transistor ST. FIG. 2 further shows and a bit line contact $C_B$ formed in the inter layer dielectrics 231 and 232, and disposed on a diffusion layer 201 which is located by the side of the other select transistor ST.

FIG. 2 further shows a source line 132 formed on the inter layer dielectric 231 and the source line contact $C_S$, and a bit line 131 formed on the inter layer dielectrics 231, 232 and the bit line contact $C_B$. In this embodiment, the bit lines 131 are disposed above the source lines 132, so that the bit lines 131 and the source lines 132 intersect without contact.

Figure 3:
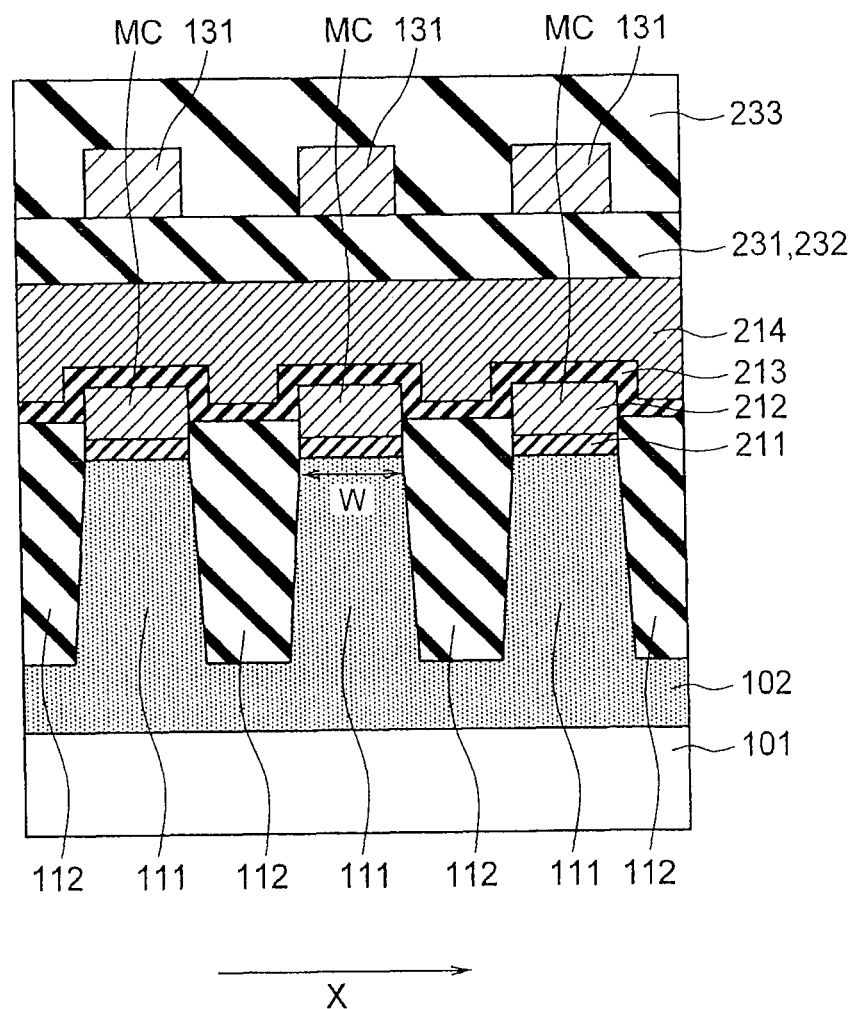
FIG. 3 is a side sectional view showing a section (J-J' section) of the semiconductor memory device of FIG. 1.

FIG. 3 is a side sectional view showing a section of the semiconductor memory device of FIG. 1. FIG. 3 is a sectional view taken along a line J-J' shown in FIG. 1.

FIG. 3 shows three memory cell transistors MC formed on the device regions 111 in the well region 102. FIG. 3 further shows the isolation regions 112 which isolate the well region 102 into the device regions 111.

As shown in FIG. 3, the intergate insulator 213 and the control gate 214 are formed continuously between the memory cell transistors MC which are adjacent in the X direction. The control gate 214 forms a word line of the semiconductor memory device. Furthermore, the bit lines 131 are disposed above the control gate 214 via the inter layer dielectrics 231 and 232.

Hereafter, the bit lines 131 and the bit line contacts $C_B$ in this embodiment will be described in more detail referring back to FIG. 1.

FIG. 1 shows a block $B_1$ located relatively near the sense amplifier circuit 141, and a block $B_2$ located relatively away from the sense amplifier circuit 141, as an example of blocks in the memory cell array region 121. Here, each block is formed of a plurality of NAND strings STR which are adjacent in the X direction.

The distance between the block $B_2$ and the sense amplifier circuit 141 is greater than the distance between the block $B_1$ and the sense amplifier circuit 141. Therefore, the bit line resistance between the block $B_2$ and the sense amplifier circuit 141 becomes higher than the bit line resistance between the block $B_1$ and the sense amplifier circuit 141.

According to the results of study by the inventors, in the NAND memory in recent years, the NAND string STR in the write state has resistance of approximately 10 MΩ, and the NAND string STR in the erase state has resistance of approximately 1 MΩ (for example, in the case where a NAND string includes 64 NAND cells). On the other hand, one bit line 131 (between one end on the side of the sense amplifier circuit 141 and the other end on the opposite side) has resistance of approximately 2 MΩ. Therefore, the increase of the bit line resistance depending on the distance between a block and the sense amplifier circuit 141 has a great influence on the value of the cell current in the erase state. In addition, the influence becomes more remarkable as the size of the NAND memory shrinks.

In this embodiment, therefore, the contact resistance of each bit line contact $C_B$ is decreased depending on the distance between the bit line contact $C_B$ and the sense amplifier circuit 141 to cancel the increase of the bit line resistance by the decrease of the contact resistance.

According to the results of study by the inventors, each bit line contact $C_B$ has resistance in the range of 100 kΩ to 10 MΩ, so that the cancel of the increase of the bit line resistance by the decrease of the resistance of the bit line contact $C_B$ is sufficiently possible. Details of this will be described with reference to FIG. 4.

Figure 4:
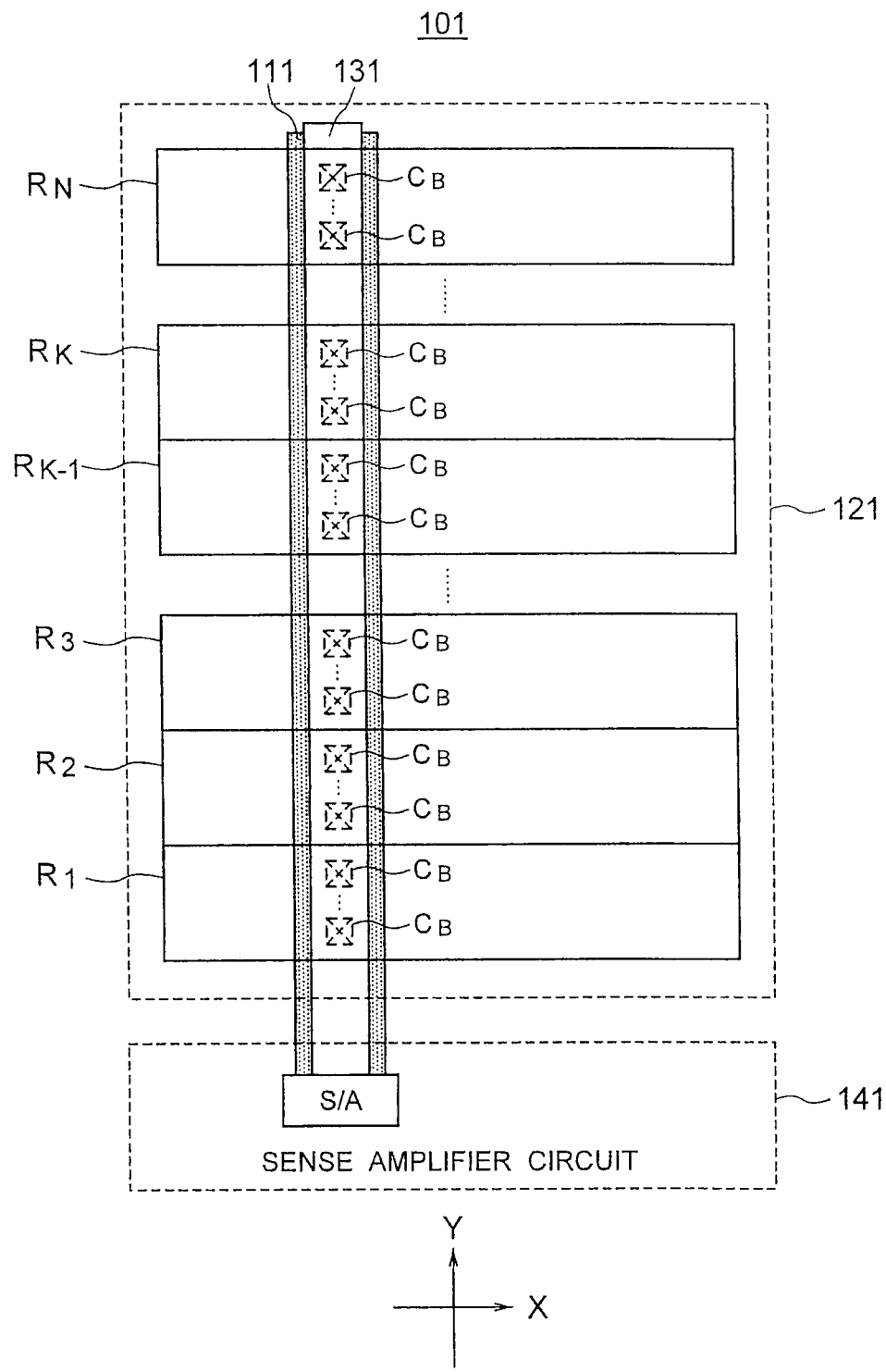
FIG. 4 is a plan view for explaining structures of bit line contacts in the semiconductor memory device of FIG. 1.

FIG. 4 is a plan view for explaining structures of the bit line contacts $C_B$ in the semiconductor memory device of FIG. 1.

In this embodiment, the memory cell array region 121 is divided into first to N-th regions $R_1$ to $R_N$ as shown in FIG. 4, where N is an integer of 2 or more. Here, a K-th region $R_K$ is located at a greater distance from the sense amplifier circuit 141 than a (K−1)-th region $R_{K-1}$, where K is an arbitrary integer of 2 to N. In other words, the first to N-th regions $R_1$ to $R_N$ have an increasing distance from the sense amplifier circuit 141 in order of the first region $R_1$, the second region $R_2$, the third region $R_3$, . . . , and the N-th region $R_N$.

In this embodiment, the contact resistance of the bit line contacts $C_B$ is set to a value which differs from region to region. More specifically, the resistance of the bit line contacts $C_B$ in the K-th region $R_K$ is set lower than the contact resistance of the bit line contacts $C_B$ in the (K−1)-th region $R_{K-1}$. In other words, the contact resistance of the bit line contacts $C_B$ decreases in order of the first region $R_1$, the second region $R_2$, the third region $R_3$, . . . , and the N-th region $R_N$.

In this embodiment, therefore, the increase of the bit line resistance depending on the distance between the block and the sense amplifier 141 is canceled by the decrease of the contact resistance of the bit line contacts $C_B$. In this embodiment, therefore, it becomes possible to suppress the variation of the cell current value in the erase state or the write state.

The number N of divisions of the memory cell array region 121 may have an arbitrary value as long as it is 2 or more. If the number N of divisions becomes great, the manufacturing process of the bit line contacts $C_B$ becomes more complicated. On the other hand, if the number N of divisions becomes great, it becomes possible to more finely adjust the way of decreasing the contact resistance.

In this embodiment, the first to N-th regions $R_1$ to $R_N$ have stripe shapes extending in the X direction. However, the first to N-th regions $R_1$ to $R_N$ may have other shapes.

Furthermore, each of the first to N-th regions $R_1$ to $R_N$ may include one block, or may include a plurality of blocks. Furthermore, the number of blocks included in each region may be different from region to region.

In this embodiment, since the increase of the bit line resistance can be canceled by the decrease of the contact resistance of the bit line contacts $C_B$, it is not necessary to change the width W (see FIG. 1) of each device region 111 depending on the distance from the sense amplifier circuit 141 to cancel the increase of the bit line resistance. In FIG. 1, the width W of each device region is set to be constant in the memory cell array region 121 irrespective of the distance from the sense amplifier circuit 141. Therefore, the processing margin of the device region 111 can be improved, so that it becomes possible to make the width of the device regions 111 and the width of the isolation regions 112 narrower. If the width W of the device regions 111 varies depending on the distance from the sense amplifier circuit 141, the characteristics of the memory cell transistor MC become different depending on the distance from the sense amplifier circuit 141. As a result, the write operation, readout operation and the like become complicated. On the other hand, if the width W of the device regions 111 is constant irrespective of the distance from the sense amplifier circuit 141 like this embodiment, the characteristics of the memory cell transistor MC do not depend on the distance from the sense amplifier circuit 141.

Hereafter, first to third examples of the structures of the bit line contacts $C_B$ will be described with reference to FIGS. 5A to 7B.

(1) FIRST EXAMPLE

FIGS. 5A and 5B are side sectional views showing the first example of the bit line contacts $C_B$.

FIG. 5A shows a bit line contact $C_B$ in the K-th region $R_K$. In FIG. 5A, $X_K$ denotes an impurity concentration of a diffusion layer 201 formed under the bit line contact $C_B$ in the K-th region $R_K$. Implanted impurities in the diffusion layer 201 are phosphorus or arsenic, for example.

FIG. 5B shows a bit line contact $C_B$ in the (K−1)-th region $R_{K-1}$. In FIG. 5B, $X_{K-1}$ denotes an impurity concentration of a diffusion layer 201 formed under the bit line contact $C_B$ in the (K−1)-th region $R_{K-1}$.

In the first example, the impurity concentration $X_K$ in the K-th region $R_K$ is set to be greater than the impurity concentration $X_{K-1}$ in the (K−1)-th region $R_{K-1}$. In other words, the impurity concentration increases in order of the first region $R_1$, the second region $R_2$, the third region $R_3$, . . . , and the N-th region $R_N$.

As a result, the contact resistance of the bit line contact $C_B$ in the K-th region $R_K$ becomes lower than the contact resistance of the bit line contact $C_B$ in the (K−1)-th region $R_{K-1}$. In the first example, therefore, the increase of the bit line resistance is canceled by the decrease of the contact resistance of the bit line contacts $C_B$.

In the first example, the impurity concentrations $X_1$ to $X_N$ in the first to N-th regions $R_1$ to $R_N$ are $1 \times 10^{20}$ cm$^{-3}$ to $1 \times 10^{22}$ cm$^{-3}$, for example.

For example, in the case where N=3, the impurity concentrations $X_1$, $X_2$ and $X_3$ may be $1 \times 10^{20}$ cm$^{-3}$, $1 \times 10^{21}$ cm$^{-3}$, and $1 \times 10^{22}$ cm$^{-3}$, respectively, or may be $5 \times 10^{20}$ cm$^{-3}$, $1 \times 10^{21}$ cm$^{-3}$, and $5 \times 10^{22}$ cm$^{-3}$ in a narrowed range, respectively.

According to the first example, it becomes possible to increase the contact resistance by adjusting the impurity implantation process when forming the diffusion layers 201.

(2) SECOND EXAMPLE

FIGS. 6A and 6B are side sectional views showing the second example of the bit line contacts $C_B$.

FIG. 6A shows a bit line contact $C_B$ in the K-th region $R_K$. In FIG. 6A, $D_K$ denotes an over etching of the bit line contact $C_B$ in the K-th region $R_K$. The over etching means a distance between the principal surface of the substrate 101 and the bottom surface of the bit line contact $C_B$.

FIG. 6B shows a bit line contact $C_B$ in the (K−1)-th region $R_{K-1}$. In FIG. 6B, $D_{K-1}$ denotes an over etching of the bit line contact $C_B$ in the (K−1)-th region $R_{K-1}$.

In the second example, the over etching $D_B$ in the K-th region $R_K$ is set to be greater than the over etching $D_{K-1}$ in the (K−1)-th region $R_{K-1}$. In other words, the over etching increases in order of the first region $R_1$, the second region $R_2$, the third region $R_3$, . . . , and the N-th region $R_N$.

As a result, the contact resistance of the bit line contact $C_B$ in the K-th region $R_K$ becomes lower than the contact resistance of the bit line contact $C_B$ in the (K−1)-th region $R_{K-1}$. In the second example, therefore, the increase of the bit line resistance is canceled by the decrease of the contact resistance of the bit line contacts $C_B$.

In the second example, the over etchings $D_1$ to $D_N$ in the first to N-th regions $R_1$ to $R_N$ are 0 to 100 nm, for example.

According to the second example, it becomes possible to increase the contact resistance by adjusting the etching process when forming contact holes for the bit line contacts $C_B$. The value of the over etching can be adjusted by changing the etching time in the etching process, for example.

(3) THIRD EXAMPLE

FIGS. 7A and 7B are plan views showing the third example of the bit line contacts $C_B$.

FIG. 7 shows a plane shape of a bit line contact $C_B$ in the K-th region $R_K$. In FIG. 7A, $S_K$ denotes a cross-sectional area of the bit line contact $C_B$ in the K-th region $R_K$, in a cross section which is parallel to the principal surface of the substrate 101.

FIG. 7B shows a plane shape of a bit line contact $C_B$ in the (K−1)-th region $R_{K-1}$. In FIG. 7B, $S_{K-1}$ denotes a cross-sectional area of the bit line contact $C_B$ in the (K−1)-th region $R_{K-1}$ in the above-described cross section.

In the third example, the cross-sectional area $S_K$ in the K-th region $R_K$ is set to be greater than the cross-sectional area $S_{K-1}$ in the (K−1)-th region $R_{K-1}$. In other words, the cross-sectional area increases in order of the first region $R_1$, the second region $R_2$, the third region $R_3$, . . . , and the N-th region $R_N$.

As a result, the contact resistance of the bit line contact $C_B$ in the K-th region $R_K$ becomes lower than the contact resistance of the bit line contact $C_B$ in the (K−1)-th region $R_{K−1}$. In the third example, therefore, the increase of the bit line resistance is canceled by the decrease of the contact resistance of the bit line contacts $C_B$.

According to the third example, it becomes possible to increase the contact resistance by adjusting the patterning process when forming contact holes for the bit line contacts $C_B$.

The plane shape of each bit line contact $C_B$ may be a quadrangle, or may be another shape.

As described above, in this embodiment, the memory cell region 121 is divided into first to N-th regions $R_1$ to $R_N$ having a distance from the sense amplifier circuit 141 which increases in the order of the first region $R_1$, ..., and the N-th region $R_N$. Furthermore, in this embodiment, the contact resistance of the bit line contact $C_B$ in the K-th region $R_K$ is set to be lower than the contact resistance of the bit line contact $C_B$ in the (K−1)-th region $R_{K−1}$, where K is an arbitrary integer of 2 to N.

Therefore, it becomes possible to cancel the increase of the bit line resistance by the decrease of the contact resistance of the bit line contacts $C_B$, thereby suppressing the variation of the value of the cell current in the erase state.

Furthermore, in this embodiment, the width W of each device region 111 is set to be constant in the memory cell array region 121 irrespective of the distance from the sense amplifier circuit 141.

Therefore, the processing margin of the device regions 111 can be improved, so that the width of the device regions 111 and the width of the isolation regions 112 can be made narrow.

In this embodiment, the first to third examples may be applied singly, or may be applied as a combination of two or more examples.

Hereafter, a second embodiment which is a modification of the first embodiment will be described. The second embodiment will be described laying stress on differences from the first embodiment.

(Second Embodiment)

Figure 8:
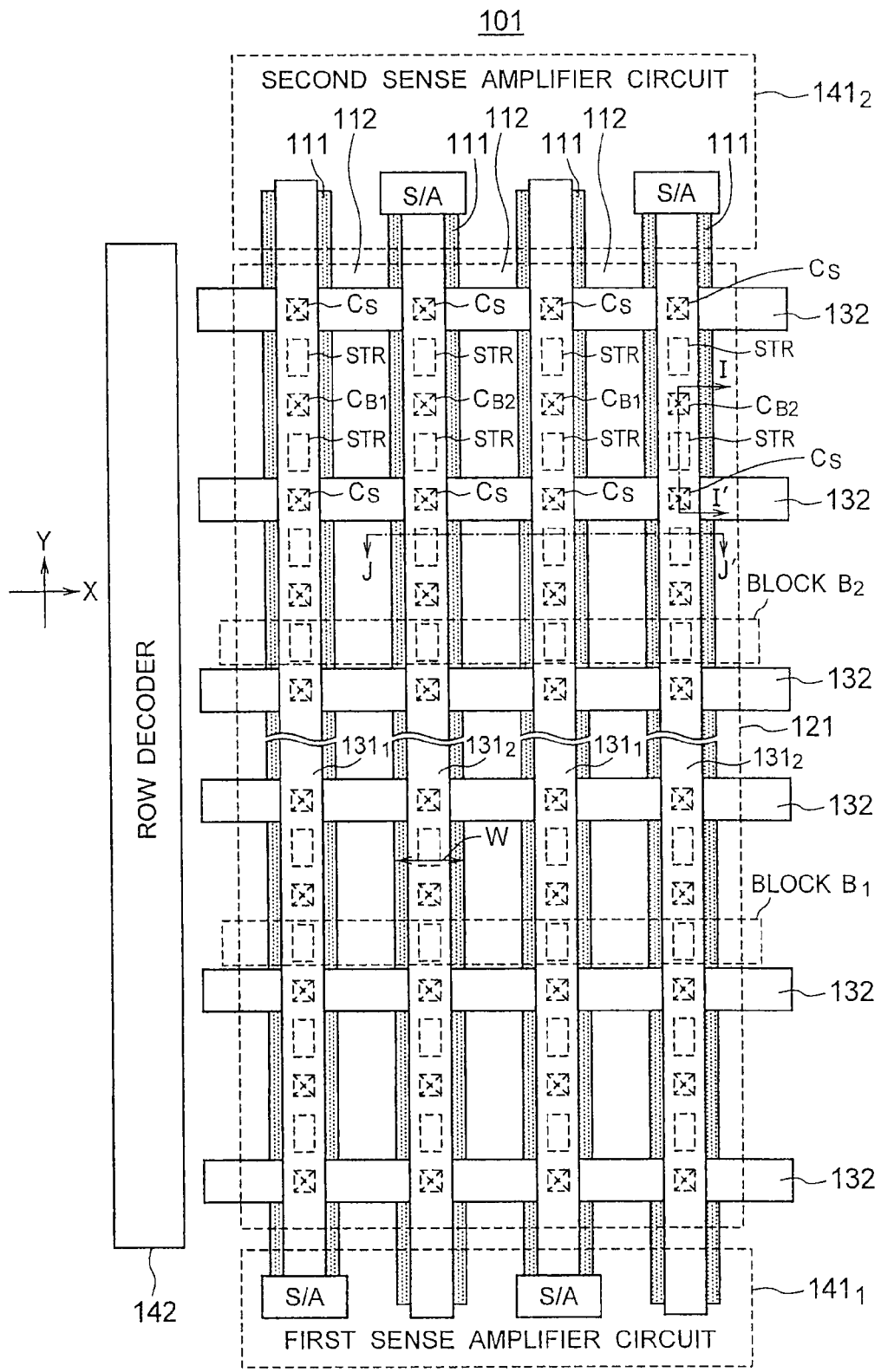
FIG. 8 is a plan view showing a structure of a nonvolatile semiconductor memory device of a second embodiment.

FIG. 8 is a plan view showing a structure of a nonvolatile semiconductor memory device of the second embodiment.

FIG. 8 shows first bit lines $131_1$ formed to extend in the Y direction, and electrically connected to a first sense amplifier circuit $141_1$ on the substrate 101 at ends of the first bit lines $131_1$ on the "−Y" direction side. FIG. 8 further shows second bit lines $131_2$ formed to extend in the Y direction, and electrically connected to a second sense amplifier circuit $141_2$ on the substrate 101 at ends of the second bit lines $131_2$ on the "+Y" direction side.

The first and second bit lines $131_1$ and $131_2$ are disposed alternately along the X direction, and form so-called comb-structured bit lines. The ends on the "−Y" direction side are an example of ends on one side, and the ends on the "+Y" direction side are an example of ends on the other side.

As shown in FIG. 8, the first bit lines $131_1$ are electrically connected to the device regions 111 by first bit line contacts $C_{B1}$ which are formed on the device regions 111. Furthermore, the second bit lines $131_2$ are electrically connected to the device regions 111 by second bit line contacts $C_{B2}$ which are formed on the device regions 111.

In this embodiment, the contact resistance of the bit line contacts is decreased depending on the distance between the bit line contacts and the sense amplifier circuit to cancel the increase of the bit line resistance by the decrease of the contact resistance in the same way as the first embodiment.

In this embodiment, however, the contact resistance of the first bit line contacts $C_{B1}$ is decreased depending on the distance between the first bit line contacts $C_{B1}$ and the first sense amplifier circuit $141_1$. On the other hand, the contact resistance of the second bit line contacts $C_{B2}$ is decreased depending on the distance between the second bit line contacts $C_{B2}$ and the second sense amplifier circuit $141_2$.

Therefore, it becomes possible to cancel the increase of the bit line resistance by the decrease of the contact resistance of the first and second bit lines $131_1$ and $131_2$. Details of this will be described with reference to FIG. 9.

Figure 9:
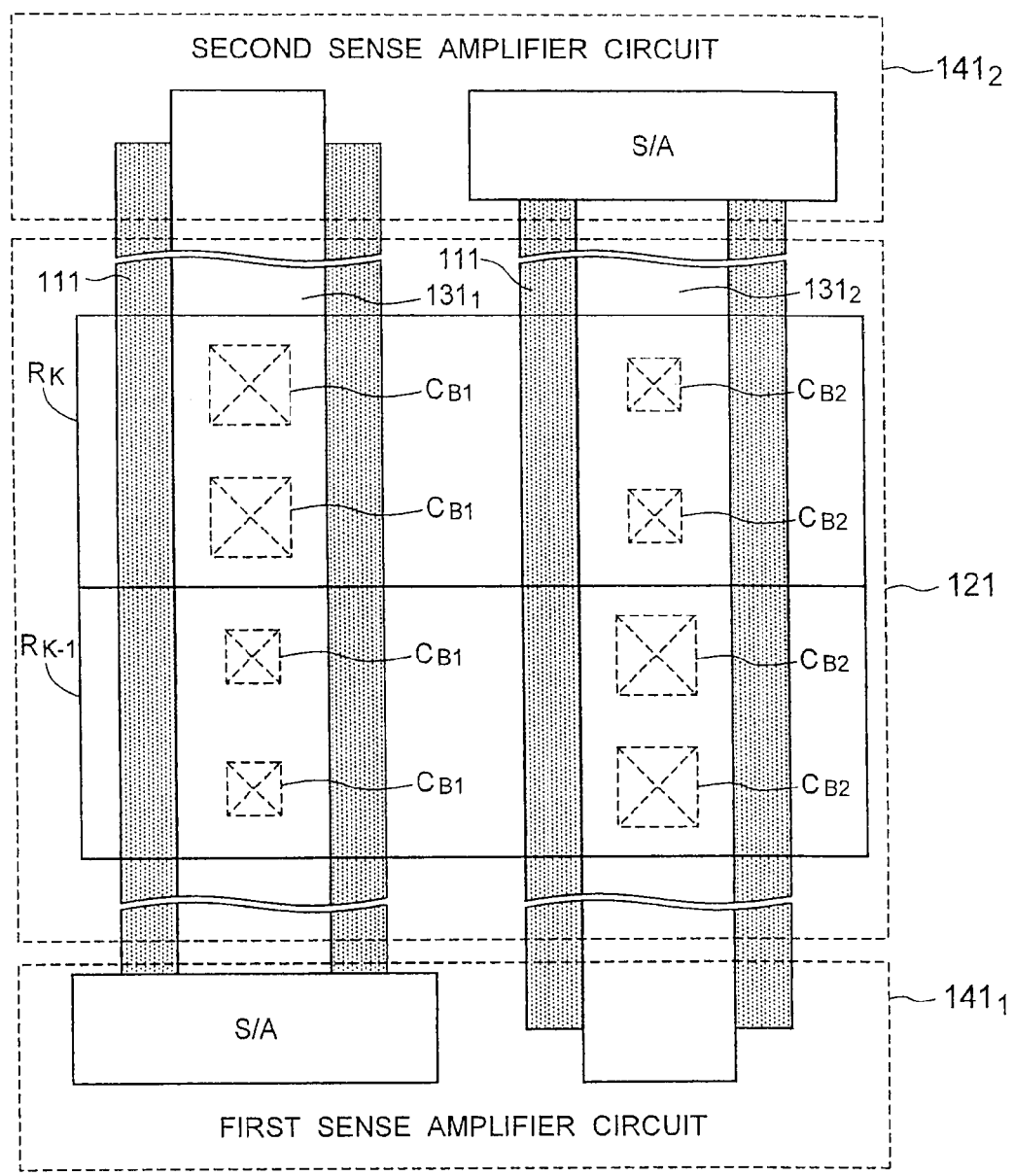
FIG. 9 is a plan view for explaining structures of first and second bit line contacts in the semiconductor memory device shown of FIG. 8.

FIG. 9 is a plan view for explaining structures of the first and second bit line contacts $C_{B1}$ and $C_{B2}$ in the semiconductor memory device of FIG. 8.

In this embodiment, the memory cell array region 121 is divided into the first to N-th regions $R_1$ to $R_N$ in the same way as the first embodiment (see FIG. 4). Among the first to N-th regions $R_1$ to $R_N$, FIG. 9 shows the K-th and (K−1)-th regions $R_K$ and $R_{K−1}$.

In this embodiment, the K-th region $R_K$ is located at a greater distance from the first sense amplifier circuit $141_1$ than the (K−1)-th region $R_{K−1}$, and the K-th region $R_K$ is located at a smaller distance from the second sense amplifier circuit $141_2$ than the (K−1)-th region $R_{K−1}$. In other words, the first to N-th regions $R_1$ to $R_N$ have an increasing distance from the first sense amplifier circuit $141_1$ in order of the first region $R_1$, the second region $R_2$, the third region $R_3$, ..., and the N-th region $R_N$, and have a decreasing distance from the second sense amplifier circuit $141_2$ in that order.

Furthermore, in this embodiment the contact resistance of the first and second bit line contacts $C_{B1}$ and $C_{B2}$ is set to a value which differs from region to region.

First, the contact resistance of the first bit line contact $C_{B1}$ in the K-th region $R_K$ is set to become lower than the contact resistance of the first bit line contact $C_{B1}$ in the (K−1)-th region $R_{K−1}$. In other words, the contact resistance of the first bit line contacts $C_{B1}$ decreases in order of the first region $R_1$, the second region $R_2$, the third region $R_3$, ..., and the N-th region $R_N$.

On the other hand, the contact resistance of the second bit line contact $C_{B2}$ in the K-th region $R_K$ is set to become higher than the contact resistance of the second bit line contact $C_{B2}$ in the (K−1)-th region $R_{K−1}$. In other words, the contact resistance of the second bit line contacts $C_{B2}$ increases in order of the first region $R_1$, the second region $R_2$, the third region $R_3$, ..., and the N-th region $R_N$.

Therefore, the increase of the bit line resistance of the first bit lines $131_1$ depending on the distance between the block and the first sense amplifier $141_1$ is canceled by the decrease of the contact resistance of the first bit line contacts $C_{B1}$.

On the other hand, the increase of the bit line resistance of the second bit lines $131_2$ depending on the distance between the block and the second sense amplifier $141_2$ is canceled by the decrease of the contact resistance of the second bit line contacts $C_{B2}$.

Therefore, according to this embodiment, it becomes possible to suppress the variation of the cell current value in the erase state, in the case where the sense amplifier circuits $141_1$ and $141_2$ are provided on both sides of the bit lines $131_1$ and $131_2$.

In this embodiment, it is desirable to apply the third example among the first to third examples. In other words, it is desirable to adjust the contact resistance of the first and second bit line contacts $CB_1$ and $CB_2$ not by adjusting the impurity concentration or the over etching, but by adjusting the cross-sectional area of the bit line contacts. The reason is that it is relatively difficult from the viewpoint of size shrinking to change the impurity concentration or the over etching every other bit line, whereas it is relatively easy to change the cross-sectional area of the bit line contacts every other bit line. For example, it can be realized by changing the dimensions of the bit line contacts every other bit line in the lithography mask used when forming the bit line contacts.

FIG. 9 shows a case where the third example is applied to this embodiment. In FIG. 9, the cross-sectional area of the first bit line contacts $C_{B1}$ in the K-th region $R_K$ is set to be greater than the cross-sectional area of the first bit line contacts $C_{B1}$ in the (K−1)-th region $R_{K-1}$. On the other hand, the cross-sectional area of the second bit line contacts $C_{B2}$ in the K-th region $R_K$ is set to be smaller than the cross-sectional area of the second bit line contacts $C_{B2}$ in the (K−1)-th region $R_{K-1}$.

In this way, the memory cell array region 121 in this embodiment is divided into the first to N-th regions $R_1$ to $R_N$ having an increasing distance from the first sense amplifier circuit $141_1$ in the order of the first region $R_1, \ldots,$ and the N-th region $R_N$ and having a decreasing distance from the second sense amplifier circuit $141_2$ in that order.

In addition, the contact resistance of the first bit line contacts $C_{B1}$ in the K-th region $R_K$ is set to become lower than the contact resistance of the first bit line contacts $C_{B1}$ in the (K−1)-th region $R_{K-1}$, where K is an arbitrary integer of 2 to N. In addition, the contact resistance of the second bit line contacts $C_{B2}$ in the K-th region $R_K$ is set to become higher than the contact resistance of the second bit line contacts $C_{B2}$ in the (K−1)-th region $R_{K-1}$.

Therefore, it is possible to cancel the increase of the bit line resistance in the case where the sense amplifier circuits $141_1$ and $141_2$ are provided on both sides of the bit lines $131_1$ and $131_2$ by decreasing the contact resistance of the bit line contacts $C_{B1}$ and $C_{B2}$, thereby suppressing the variation of the cell current value in the erase state.

Furthermore, in this embodiment, the width W of each device region 111 is set to be constant in the memory cell array region 121 irrespective of the distances from the first and second sense amplifier circuit $141_1$ and $141_2$ as shown in FIG. 8.

Therefore, the processing margin of the device regions 111 can be improved, so that the width of the device regions 111 and the width of the isolation regions 112 can be made narrow in the same way as the first embodiment.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
    a substrate;
    device regions formed in the substrate to extend in a first direction which is parallel to a surface of the substrate;
    a memory cell array region including a plurality of memory cells disposed on the device regions;
    bit lines disposed above the substrate to extend in the first direction;
    a sense amplifier circuit electrically connected to the bit lines at ends of the bit lines on one side; and
    bit line contacts disposed on the device regions to electrically connect the device regions to the bit lines,
    wherein
    the memory cell array region includes first to N-th regions where N is an integer of two or more,
    a K-th region is located at a greater distance from the sense amplifier circuit than a (K−1)-th region, where K is an arbitrary integer of 2 to N,
    contact resistance of the bit line contacts in the K-th region is lower than contact resistance of the bit line contacts in the (K−1)-th region, and
    a width of each device region is constant in the memory cell array region.

2. The device of claim 1, wherein
    an impurity concentration of diffusion layers disposed under the bit line contacts in the K-th region is greater than an impurity concentration of diffusion layers disposed under the bit line contacts in the (K−1)-th region.

3. The device of claim 2, wherein
    the impurity concentrations of the diffusion layers disposed under the bit line contacts in the first to N-th regions are $1\times10^{20}$ cm$^{-3}$ to $1\times10^{22}$ cm$^{-3}$.

4. The device of claim 1, wherein
    a distance between the surface of the substrate and a bottom of the bit line contacts in the K-th region is greater than a distance between the surface of the substrate and a bottom of the bit line contacts in the (K−1)-th region.

5. The device of claim 4, wherein
    the distances between the surface of the substrate and bottoms of the bit line contacts in the first to N-th regions are 100 nm or less.

6. The device of claim 1, wherein
    in a plane parallel to the surface of the substrate, a sectional area of each bit line contact in the K-th region is greater than a sectional area of each bit line contact in the (K−1)-th region.

7. The device of claim 1, wherein
    the contact resistance of each bit line contact is 100 kΩ to 10 MΩ.

8. The device of claim 1, wherein
    the first to N-th regions have stripe shapes extending in a second direction which is perpendicular to the first direction.

9. The device of claim 1, wherein
    the sense amplifier circuit comprises a plurality of sense amplifiers, each of which is electrically connected to a bit line.

10. A nonvolatile semiconductor memory device comprising:
    a substrate;
    device regions formed in the substrate to extend in a first direction which is parallel to a surface of the substrate;
    a memory cell array region including a plurality of memory cells disposed on the device regions;
    first bit lines disposed above the substrate to extend in the first direction, and electrically connected to a first sense amplifier circuit on the substrate at ends of the first bit lines on one side;
    second bit lines disposed above the substrate to extend in the first direction, and electrically connected to a second sense amplifier circuit on the substrate at ends of the second bit lines on the other side;
    first bit line contacts disposed on the device regions to electrically connect the device regions to the first bit lines; and
    second bit line contacts disposed on the device regions to electrically connect the device regions to the second bit lines,
    wherein the memory cell array region includes first to N-th regions where N is an integer of two or more, a K-th region is located at a greater distance from the first sense amplifier circuit than a (K−1)-th region, where K is an arbitrary integer of 2 to N, contact resistance of the first bit line contacts in the K-th region is lower than contact resistance of the first bit line contacts in the (K−1)-th region, the K-th region is located at a smaller distance from the second sense amplifier circuit than the (K−1)-th region, contact resistance of the second bit line contacts in the K-th region is higher than contact resistance of the second bit line contacts in the (K−1)-th region, and a width of each device region is constant in the memory cell array region.

11. The device of claim 10, wherein an impurity concentration of diffusion layers disposed under the first bit line contacts in the K-th region is greater than an impurity concentration of diffusion layers disposed under the first bit line contacts in the (K−1)-th region, and an impurity concentration of diffusion layers disposed under the second bit line contacts in the K-th region is smaller than an impurity concentration of diffusion layers disposed under the second bit line contacts in the (K−1)-th region.

12. The device of claim 11, wherein the impurity concentrations of the diffusion layers disposed under the first and second bit line contacts in the first to N-th regions are $1\times10^{20}$ cm$^{-3}$ to $1\times10^{22}$ cm$^{-3}$.

13. The device of claim 10, wherein a distance between the surface of the substrate and a bottom of the first bit line contacts in the K-th region is greater than a distance between the surface of the substrate and a bottom of the first bit line contacts in the (K−1)-th region, and a distance between the surface of the substrate and a bottom of the second bit line contacts in the K-th region is smaller than a distance between the surface of the substrate and a bottom of the second bit line contacts in the (K−1)-th region.

14. The device of claim 13, wherein the distances between the surface of the substrate and bottoms of the first and second bit line contacts in the first to N-th regions are 100 nm or less.

15. The device of claim 10, wherein in a plane parallel to the surface of the substrate, a sectional area of each first bit line contact in the K-th region is greater than a sectional area of each first bit line contact in the (K−1)-th region, and in the plane parallel to the surface of the substrate, a sectional area of each second bit line contact in the K-th region is smaller than a sectional area of each second bit line contact in the (K−1)-th region.

16. The device of claim 10, wherein the first and second bit lines are alternately disposed along a second direction which is perpendicular to the first direction.

17. The device of claim 10, wherein the contact resistance of each of the first and second bit line contacts is 100 kΩ to 10 MΩ.

18. The device of claim 10, wherein the first to N-th regions have stripe shapes extending in a second direction which is perpendicular to the first direction.

19. The device of claim 10, wherein the first sense amplifier circuit comprises a plurality of first sense amplifiers, each of which is electrically connected to a first bit line, and the second sense amplifier circuit comprises a plurality of second sense amplifiers, each of which is electrically connected to a second bit line.

* * * * *